April 12, 1966 R. J. SANFORD 3,246,172
FOUR-LAYER SEMICONDUCTOR SWITCH WITH MEANS TO PROVIDE
RECOMBINATION CENTERS
Filed March 26, 1963

INVENTOR.
RICHARD J. SANFORD

BY [signature]

ATTORNEY.

United States Patent Office 3,246,172

Patented Apr. 12, 1966

3,246,172

FOUR-LAYER SEMICONDUCTOR SWITCH WITH MEANS TO PROVIDE RECOMBINATION CENTERS

Richard J. Sanford, Silver Spring, Md., assignor to the United States of America as represented by the Secretary of the Navy Filed Mar. 26, 1963, Ser. No. 268,163

8 Claims. (Cl. 307—88.5)

Figure 1:
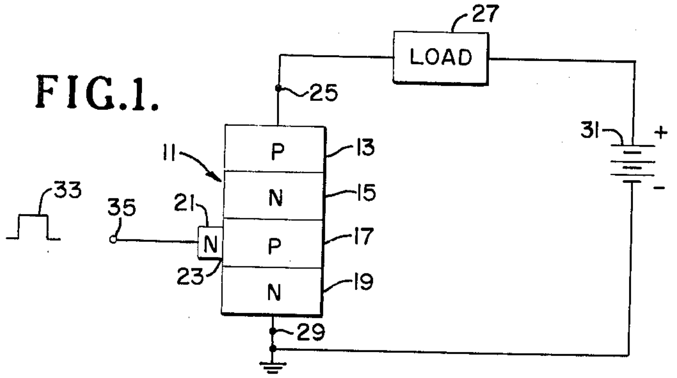

The invention described herein may be manufactured and used by or for the Government of the United States of America for governmental purposes without the payment of any royalties thereon or therefor.

This invention relates to a semiconductor switch device and pore particularly to PNPN semiconductor device used as a switch which is insensitive to R-F energy.

In using electronic switching devices in the presence of high intensity R-F energy fields, the problem of inadvertent operation of such a switch by R-F energy must be contended with. Such devices as external filter circuits have been used in the past with the disadvantage of making the switching circuit larger and more expensive. Another disadvantage of such external filters is that R-F energy may bypass these devices making them ineffective for their intended use.

In this invention a PNPN type semiconductor is provided with an additional block of N type semiconductor material. This block is connected to the second P region of the semiconductor body at a rectifying junction. This rectifying junction contact replaces the usual ohmic gate contact. The rectifying junction has a low break-down voltage and a high resistance.

When a small alternating current such as an R-F current, for example, is applied to a gate terminal of a semiconductor, the rectifying junction will place a negative D.-C. bias on the emitter junction of the semi-conductor. When a positive D.-C. signal is applied to the gate which exceeds the breakdown voltage of the rectifying junction, this voltage must be sustained long enough to discharge the negative charge on the gate block and to charge the emitter junction in the opposite direction before firing is possible. The gate junction resistance and the emitter junction capacitance determine the time required, and this time may be made large enough to render the device insensitive to the positive portions of an R-F signal.

It is an object of this invention to provide a semiconductor switch which is insensitive to R-F energy.

Another object of this invention is to provide a PNPN semiconductor body with a second semiconductor body having a negative region attached thereto with a rectifying junction therebetweeen.

A further object of this invention is to provide an R-F insensitive semiconductor switch having alternate positive and negative regions and a negative region connected to one of the positive regions by a rectifying junction whereby R-F energy is blocked.

A still further object of this invention is to provide an R-F insensitive semiconductor switch for causing conduction through a load circuit when voltage pulses are applied to the switch.

Figure 2A:
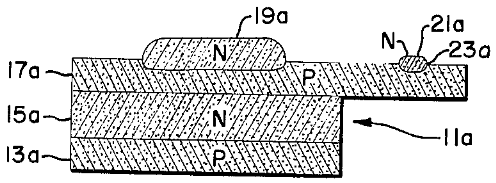
Figure 2B:
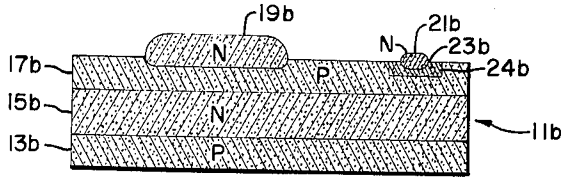
Figure 2C:
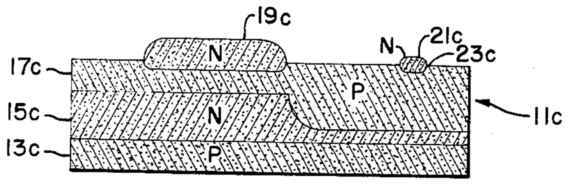

Other objects and many of the attendant advantages of this inventon will be readily appreciated as the same becomes better understood by reference to the detailed description when considered in connection with the accompanying drawing in which like reference numerals designate like parts through the figures thereof and wherein:

FIG. 1 of the drawings illustrates a circuit utilizing the semi-conductor switch of the present invention; and FIG. 2*a*, 2*b*, and 2*c* of the drawings are cross sectional views of various embodiments of the semiconductor switch of the present invention.

In the circuit arrangement of FIG. 1, a four zone PNPN type semiconductor switch 11 is shown having a P-type or positive zone 13, N-type or negative zone 15, positive zone 17, and negative zone 19. An additional negative zone 21 is connected to positive zone 17 by a rectifying junction 23 therebetween.

Semiconductor switch 11 is shown having an anode terminal 25 connected to a load 27 and a cathode terminal 29 connected to ground. A source of D.-C. voltage 31 is connected between load 27 and ground.

In operation, semiconductor switch 11 will act as an open circuit in which no current will flow between anode 25 and cathode 27 and no current will flow through load 27 as long as there is no voltage applied to negative zone 21. When a positive pulse 33 is applied to terminal 35, current flow will be established between negative zone 21 and positive zone 17, causing current flow to be established between the anode 25 and cathode 29 of the semiconductor. The semiconductor will now act as a closed circuit with current flowing through load 27. Current flow will continue through semiconductor 11 and through load 27 after the application of pulse 33 has ended.

Referring now to FIG. 2*a* of the drawing in which a sectional view of an embodiment of a semiconductor switch of this invention is illustrated, semiconductor body **11*a* is comprised of positive zone 13*a*, negative zone 15*a*, positive zone 17*a*, and negative zone 19*a*. Semiconductor material having a negative zone 21*a* is connected to the positive zone or region 17*a* of semiconductor switch body 11*a*. A portion of the conductor body under the region 17*a* has been removed in order to prevent the electron flow from negative zone 21*a* through positive zone 17*a* to negative zone 15*a* which electron flow would establish an undesired current flow in the semiconductor switch. This undesired current flow is prevented by the removal of part of negative or N type region 15*a* and positive or P type region 13*a* which provides a longer path between negative regions 15*a* and 21*a* in which recombination centers will act to block electron flow between regions 15*a* and 21*a***.

In FIG. 2*b* of the drawings another embodiment of a semiconductor is shown in which a positive region is diffused with copper or nickel to provide recombination centers between negative regions of the semiconductor. Semiconductor switch body **11*b* is shown having positive region 13*b*, negative region 15*b*, positive region 17*b*, and negative region 19*b*. A semiconductor body 21*b* having a negative region joins the main semiconductor body through resistive junction 23*b*. The semiconductor portion 24*b*** at the junction is a positive region that is provided with additional recombination centers by diffusion of copper or nickel in a positive region semiconductor material.

In FIG. 2*c* of the drawing, semiconductor switch body **11*c* has a positive region 13*c*, negative region 15*c*, positive region 17*c* and negative region 19*c*. A semiconductor body 21*c* having a negative region, is joined to a portion of the surface of positive region 17*c* through resistive junction 23*c*. The positive region 17*c* is made with a greater thickness at the portion near the juncture of the negative region of semiconductor 21*c* to provide additional recombination centers between semiconductor 21*c* and the negative region 15*c* of semiconductor 11*c* so that there will be no current flow therebetween when there is no signal applied to semiconductor 21*c***.

Obviously many modifications and variations are possible in the light of the above teachings. It is therefore to be understood, that within the scope of the appended claims, the invention may be practiced otherwise than as specifically described.

What is claimed as new and desired to be secured by Letters Patent of the United States is:

1. A semiconductor switch comprising a first semiconductor body having a first P type region,
a first N type region,
a second P type region,
a second N type region,
a second semiconductor body having an N type region, said second semiconductor body connected to said second P type region of said first semiconductor body with a rectifying junction therebetween, means for forming recombination centers between said rectifying junction and said first N type region to prevent current flow therebetween when a signal of insufficient duration and magnitude is applied to said second semiconductor body.

2. A semiconductor switch comprising a first semiconductor body having a first P type region,
a first N type region,
a second P type region and a second N type region,
a second semiconductor body having an N type region, said second semiconductor body being connected to said second P type region of said first semiconductor body with a rectifying junction therebetween,
means for forming recombination centers between said rectifying junction and said first N type region to prevent current flow therebetween when a signal of insufficient duration and magnitude is applied to said second semiconductor body,
a D.-C. voltage source having a negative terminal and a positive terminal,
load means,
means connecting said load to said positive terminal and to the said first P type region,
means connecting said negative terminal to said second N type region,
terminal means connected to said second semiconductor body, said terminal means connectable to a source of positive voltage pulses.

3. A semiconductor switch means comprising a four-layer first semiconductor body having a first P type region,
a first N type region,
a second P type region,
a second N type region,
a second semiconductor body having an N type region,
a rectifying junction joining said second P type region and said second semiconductor body having said N type region,
means for providing sufficient recombination centers between said second semiconductor body and said first N type region to prevent current flow therebetween when a signal of insufficient duration and magnitude is applied to said second semiconductor body.

4. A semiconductor switch comprising a first semiconductor body having a first layer, a second layer, a third layer, and a fourth layer, said first and third layers having P type regions, said second and fourth layers having N type regions,
a second semiconductor body having an N type region said second semiconductor body being connected to said third layer of said first semiconductor body through a rectifying junction,
a D.-C. voltage source having a positive terminal and a negative terminal,
load means,
means connecting said load means to said first layer and to said positive terminal,
means connecting said negative terminal to said fourth layer,
means connecting said second semiconductor body to a source of positive voltage pulses whereby current flow may be established through said first semiconductor body causing said load means to be connected to said D.-C. voltage source,
means providing recombination centers between said second layer and said second semiconductor body.

5. A semiconductor switch as in claim 4 in which the means providing recombination centers is a portion of said third layer extending beyond said second layer.

6. A semiconductor switch as in claim 4 in which the means providing recombination centers is a P-type region diffused with copper.

7. A semiconductor switch as in claim 4 in which the means providing recombination centers is a P-type region diffused with nickel.

8. A semiconductor switch as in claim 4 in which the means providing recombination centers is said third layer having an enlarged thickness at the junction between said third layer and said second semiconductor body.

References Cited by the Examiner

UNITED STATES PATENTS

| | | | |
|---|---|---|---|
| 2,967,793 | 1/1961 | Philips | 317—235 |
| 3,124,703 | 3/1964 | Sylvan | 307—88.5 |
| 3,152,024 | 10/1964 | Diedrich | 148—177 |
| 3,210,560 | 10/1965 | Stehney | 307—88.5 |

FOREIGN PATENTS 216,050 7/1961 Austria.

ARTHUR GAUSS, *Primary Examiner.*

J. ZAZWORSKY, *Assistant Examiner.*